(12) United States Patent
Kim et al.

(10) Patent No.: US 6,697,288 B2
(45) Date of Patent: Feb. 24, 2004

(54) BIT LINE VOLTAGE REGULATION CIRCUIT

(75) Inventors: Ki-Seog Kim, Ichon-shi (KR); Keun-Woo Lee, Ichon-shi (KR); Seoung-Ouk Choi, Ichon-shi (KR); Keon-Soo Shim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 73 days.

(21) Appl. No.: 10/029,283

(22) Filed: Dec. 28, 2001

(65) Prior Publication Data

US 2002/0089375 A1 Jul. 11, 2002

(30) Foreign Application Priority Data

Dec. 29, 2000 (KR) ......................................... 2000-85177

(51) Int. Cl.[7] ................................................. G11C 7/00
(52) U.S. Cl. ............................ 365/189.11; 365/185.18; 365/185.23; 365/189.06
(58) Field of Search ....................... 365/189.06, 189.11, 365/226, 185.18, 185.23

(56) References Cited

U.S. PATENT DOCUMENTS 5,781,474 A * 7/1998 Sali et al. ............... 365/185.18
6,184,670 B1 * 2/2001 Mulatti et al. ............... 323/314
6,347,058 B1 * 2/2002 Houghton et al. .......... 365/203

* cited by examiner

*Primary Examiner*—Van Thu Nguyen
(74) *Attorney, Agent, or Firm*—Birch, Stewart, Kolasch & Birch, LLP

(57) ABSTRACT

A bit line voltage regulation circuit achieves uniform program features and precise cell distribution by providing a high voltage to a bit line regardless of a cell state. For this purpose, the regulation circuit includes a boosting unit for generating the high voltage, a switching unit, connected between the boosting unit and the bit line of a memory cell array, for transferring the high voltage to the bit line and an amplifying unit, for detecting a voltage drop at a detection node on the bit line caused by resistance on the bit line, amplifying the detected voltage drop to produce an amplified voltage driving the switching unit.

6 Claims, 4 Drawing Sheets

FIG. 3

| Case | | I | II | III |
|---|---|---|---|---|
| Current(mA) | | 2 | 1 | 0 |
| Voltage drop | 1000 Ω | 2.0V | 1.0V | 0V |
| Bit line voltage | | 5.5 | 3.5V | 4.5V | 5.5V |
| Voltage drop | 1500 Ω | 3.0V | 1.5V | 0V |
| Bit line voltage | 5.5 | 2.5V | 4.0V | 5.5V |
| | 6 | 3.0V | 4.5V | 6.0V |

FIG. 4

| Case | I | II | III |
|---|---|---|---|
| Current(mA) | 2 | 1 | 0 |
| Detected voltage when Rd is 100 Ω | 0.2V | 0.1V | 0V |
| Voltage drop when Rd+Rx is 1500 Ω | 3.0V | 1.5V | 0V |
| Supplied voltage when Vd is 4V | 7.5V | 5.5V | 4.0V |
| Practical bit line voltage (Vpx) | 4V | 4V | 4V |

BIT LINE VOLTAGE REGULATION CIRCUIT

RELATED APPLICATIONS

This non-provisional application claims priority under 35 U.S.C. §119(a) on Patent Application No. 2000-85177 filed in Korea on Dec. 29, 2000, which is herein incorporated by reference.

BACKGROUND OF THE INVENTION

1. Field of the Invention

The present invention relates to a semiconductor memory device; and, more particularly, to a bit line voltage regulation circuit capable of achieving uniform program features and precise cell distribution by providing a high voltage to a bit line regardless of a cell state by detecting a current variation on the bit line depending on the cell state, and a voltage drop caused by resistance on the bit line and feeding back the detected values to a boosting unit having a self-compensating ability.

2. Description of the Related Art

Referring to FIGS. 1 and 2, there are shown program features and drain junction features of a flash EEPROM using a hot carrier injection method to store information.

In FIG. 1, there is shown a graph representing cell threshold voltages varying according to a program time in case of supplying drain voltages Vd of 4.0 V, 3.5 V, 3.0 V and 2.5 V as changing a temperature condition.

FIG. 2 illustrates a graph depicting a drain current varying as increasing a drain voltage Vd in a condition of determining a gate voltage Vg, a source voltage Vs and a substrate voltage Vb as 0 V.

As shown in FIG. 1, when a too low drain voltage is provided to a drain, a cell cannot be programmed. On the other hand, if a too high drain voltage is supplied to the drain, a junction breakdown phenomenon may occur due to a serious drain breakdown as shown in FIG. 2. Therefore, a cell should be programmed by providing a drain voltage capable of avoiding the above two conditions, and at this time, there should be considered a voltage drop, due to resistance from a boosting unit to a junction unit. When programming the cell, a current flowing from a plurality of cells, e.g., 500 to 1000 cells, sharing a bit line is the sum of the current flowing in a selected cell for the cell program and a leakage current flowing in unselected cells, and the current flowing in the boosting unit is the sum of currents flowing through selected bit lines. Herein, if cells connected to the selected bit line are in a programmed state, there is almost no voltage drop since little current flows through the programmed cells. Specifically, as memory devices are miniaturized and integrated, resistance on a path from the boosting unit to the drain of the flash cell increases.

However, as shown in FIG. 3, in case I all of the cells sharing the selected bit line are in a erased state, a serious voltage drop occurs since the current flowing through the selected bit line increases and it is impossible to write information into the cells. On the other hand, in case III all of the cells are programmed, a voltage provided from the boosting unit cannot be properly controlled since no current flows through the bit lines, so that the voltage outputted from the boosting unit shocks on drains of the cells without a voltage drop. Meanwhile, the case II shown in FIG. 3 represents half of the cells sharing the selected bit line programmed.

SUMMARY OF THE INVENTION

It is, therefore, a primary object of the present invention to provide a bit line voltage regulation circuit capable of solving problems due to a voltage drop caused by a current difference according to a state of a cell.

In order to achieve the above object, the present invention employs a method for dynamically rectifying an output voltage of a boosting unit by feeding back a voltage drop caused according to a state of a cell to a rectifying block of the boosting unit, thereby minimizing a voltage swing at a drain of the cell.

In accordance with the present invention, there is provided a bit line voltage regulation circuit comprising: a boosting unit for generating a high voltage; a switching unit, connected between the boosting unit and a bit line of a memory cell array, for transferring the high voltage to the bit line; and an amplifying unit for detecting a voltage drop at a detection node on the bit line caused by resistance on the bit line, amplifying the detected voltage drop to produce an amplified voltage driving the switching unit.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 3 provides a table showing voltage drops in a selected bit line of a memory device;

FIG. 4 represents a table showing voltage drops in a selected bit line in accordance with an embodiment of the present invention.

DETAILED DESCRIPTION OF THE PREFERRED EMBODIMENTS

Hereinafter, an embodiment of the present invention will be described in detail with reference to the accompanying drawings.

Figure 5:
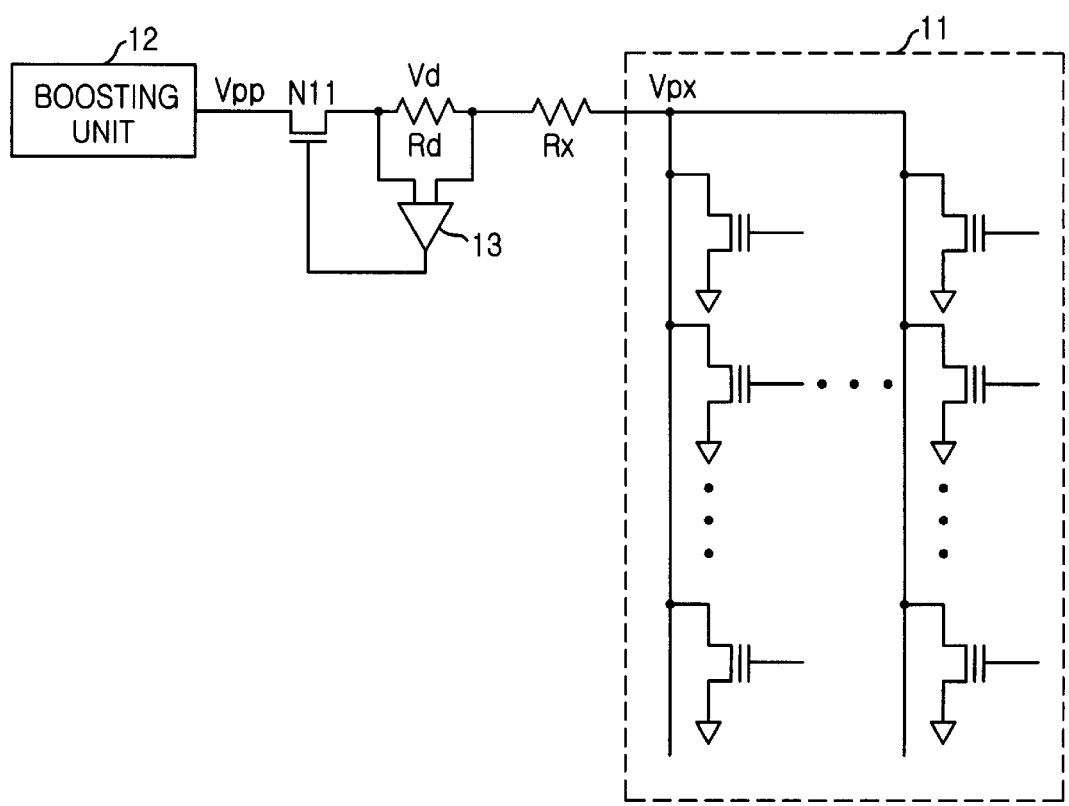
FIG. 5 depicts a constitutional diagram of a bit line voltage regulation circuit in accordance with an embodiment of the present invention.

Referring to FIG. 5, there is provided a constitutional diagram of a bit line voltage regulation circuit in accordance with the present invention.

Figure 1:
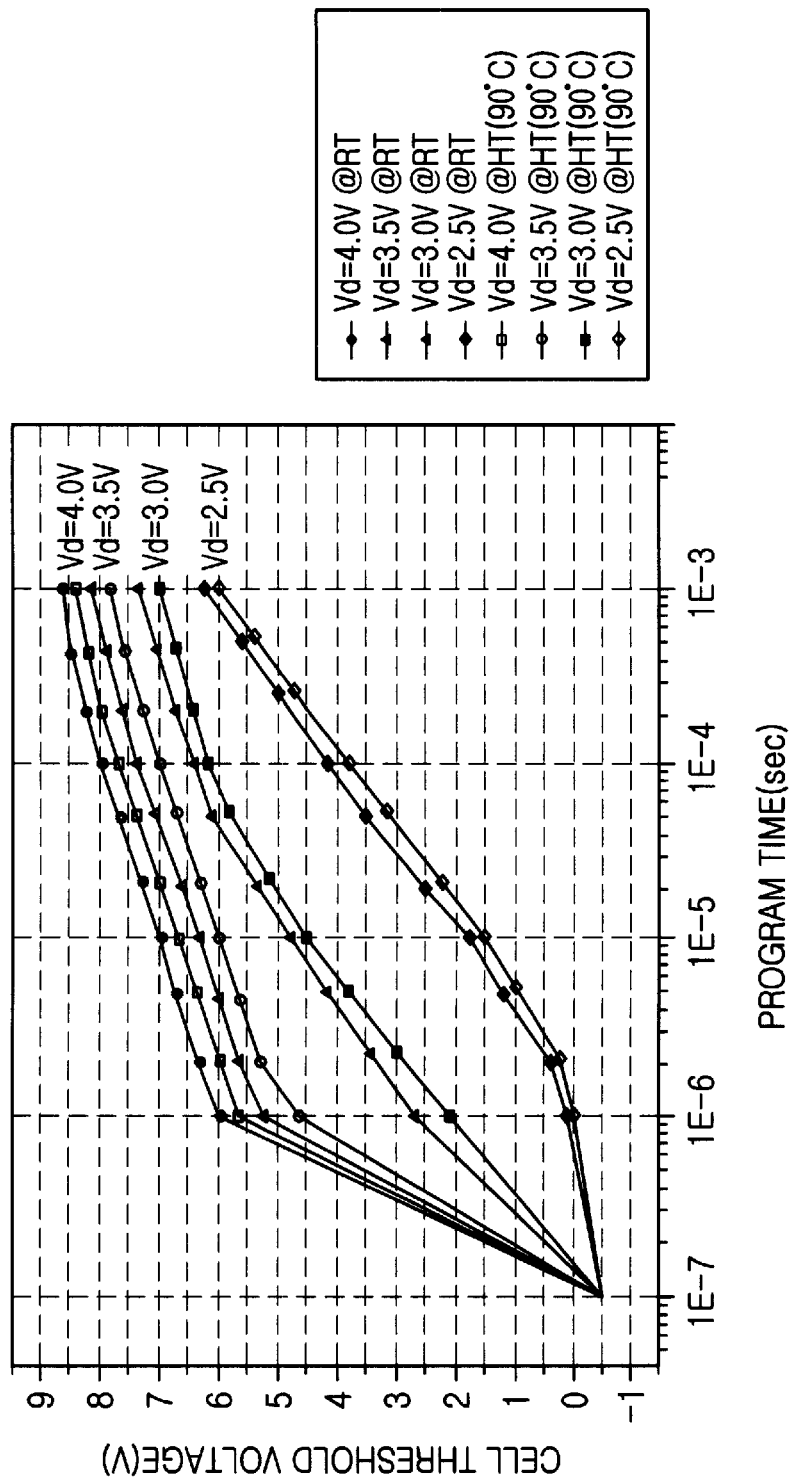
FIG. 1 shows a graph showing program features according to a drain voltage.
Figure 2:
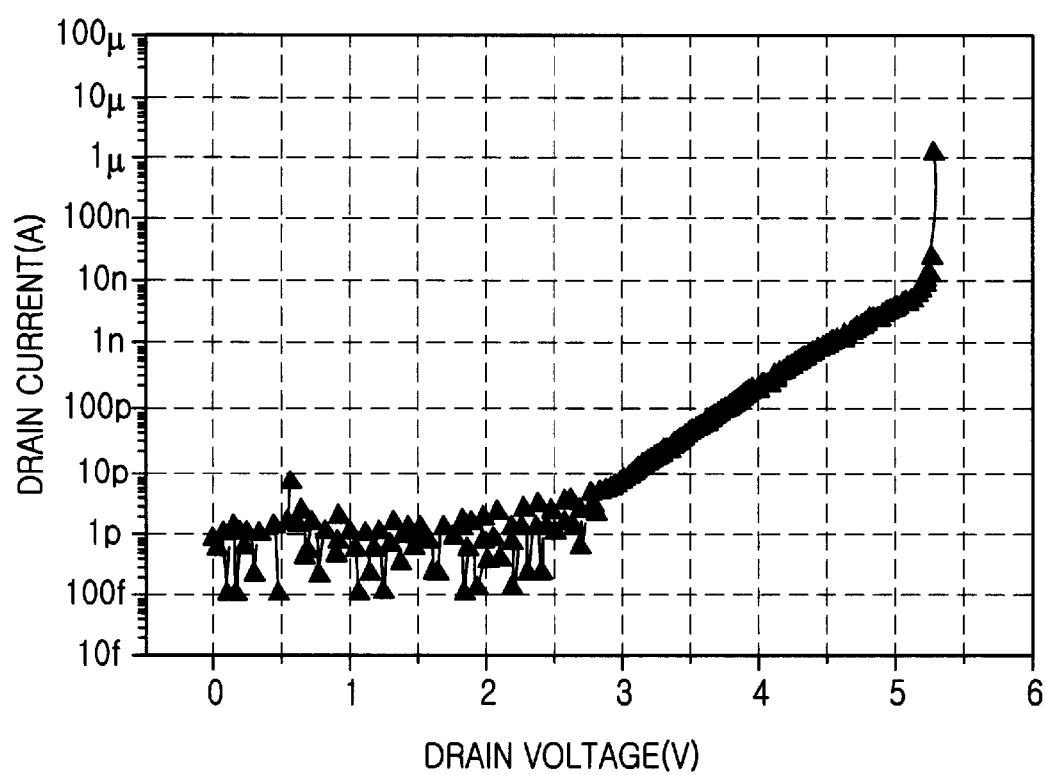
FIG. 2 illustrates a graph representing junction features according to a drain voltage.

A boosting unit 12 generates a high voltage Vpp to be provided to a bit line selected to drive a memory cell array 11. An NMOS transistor N11 is connected between an output node of the boosting unit 12 and the bit line and transfers the high voltage Vpp to the bit line. An amplifier 13 detects and amplifies a voltage drop due to resistors Rd and Rx while the high voltage Vpp is being transferred to the bit line and controls the NMOS transistor N11 by using the amplified voltage. Herein, a gain of the amplifier 13 is determined as a resistance ratio (Rd+Rx)/Rd of the total resistance on the bit line Rd+Rx to resistance Rd at a detection node. If the total resistance (Rd+Rx) is 1500 Ω and the resistance Rd at the detection node is 100 Ω, the gain of the amplifier 13 becomes 15. Therefore, the amplified voltage is calculated as the sum of a minimum voltage provided to the bit line and a threshold voltage of the NMOS transistor N11. For example, in a case of a cell having the features shown in FIGS. 1 and 2, 4.7 V (determined by summing up the minimum voltage 4 V supplied to the bit line and the threshold voltage 0.7 V of the NMOS transistor N11) is provided to a gate of the NMOS transistor N11 to thereby control a voltage outputted through the NMOS transistor N11.

As a result, the voltage supplied to the bit line can be maintained at a constant level regardless of the voltage drop due to the current variation, depending on the cell state as shown in FIG. 4.

For example, in case I all of the cells sharing the selected bit line are in an erased state, if a current of 2 mA flows through the bit line and the total resistance (Rd+Rx) on the bit line and the detection resistance Rd are 1500 Ω and 100 Ω, respectively, the voltage of the detection node becomes 0.2 V and the voltage drop due to the bit line resistance becomes 3.0 V. At this time, when the bit line voltage required for programming the memory cell is 4 V, a voltage of 7 V should be supplied to the bit line from the boosting unit 12 through the NMOS transistor N11 because the voltage drop of 3 V at the bit line should be considered.

Meanwhile, in case II half of the cells sharing the selected bit line are programmed, if a current of 1 mA flows through the bit line and the total resistance (Rd+Rx) on the bit line and the detection resistance Rd are 1500 Ω and 100 Ω, respectively, the voltage of the detection node becomes 0.1 V and the voltage drop due to the bit line resistance becomes 1.5 V. At this time, when the bit line voltage required in programming the memory cell is 4 V, a voltage of 5.5 V should be supplied to the bit line from the boosting unit 12 through the NMOS transistor N11 since the voltage drop of 1.5 V at the bit line should be considered.

Further, in case III all of the cells sharing the selected bit line are programmed, if a current of 0 mA flows through the bit line, the total resistance (Rd+Rx) on the bit line and the detection resistance Rd are 1500 Ω and 100 Ω, respectively, the voltage of the detection node becomes 0 V and the voltage drop due to the bit line resistance becomes 0 V. At this time, when the bit line voltage required for programming the memory cell is 4 V, a voltage of 4 V is supplied to the bit line from the boosting unit 12 through the NMOS transistor N11, because there is no voltage drop on the bit line.

Herein, it is enough for the high voltage Vpp outputted from the boosting unit 12 to have a sufficiently high level, determined by considering the threshold voltage of the NMOS transistor N11.

In the meantime, if an existing metal resistor is used as the resistor at the detection node, it is possible to implement the present invention through the use of a conventional layout structure without increasing the voltage drop due to the addition of the detection resistor. Further, when making an input node of the amplifier detecting, amplifying and feeding back the voltage drop at the detection node maintain high resistance like an amplification circuit using typical transistors, it is possible to reduce leakage current occurring at a feed-back circuit and, thus, decrease error.

As described above, in accordance with the present invention, the voltage drop caused by the current variation depending on the cell state and the resistance on the bit line is detected and fed back to the boosting unit having the self-compensative ability, so that the high voltage can be supplied to the bit line regardless of the cell state and, thus, it is possible to achieve uniform program features and precise cell distribution. Moreover, it is easy to implement a multi level cell capable of storing 2-bit information in one cell, doubling chip integration and taking off half the cost. Further, in accordance with the present invention, since a uniform drain voltage can be maintained regardless of the current variation, it is possible to double the number of bit lines to which the high voltage is supplied at the same time in a permitted limit of power of the boosting unit, so that the program speed in the chip operation can be doubled and the chip reliability is also enhanced.

While the present invention has been described with respect to the particular embodiments, it will be apparent to those skilled in the art that various changes and modifications may be made without departing from the spirit and scope of the invention as defined in the following claims.

What is claimed is:

1. A bit line voltage regulation circuit comprising:
   boosting means for generating a high voltage;
   switching means, connected between the boosting means and a bit line of a memory cell array, for transferring the high voltage to the bit line; and
   amplifying means for detecting a voltage drop at a detection node on the bit line caused by resistance on the bit line, amplifying the detected voltage drop to produce an amplified voltage driving the switching means,
   wherein the amplifying means generates the amplified voltage according to a ratio of the total resistance on the hit line to the resistance at the detection node.

2. The bit line voltage regulation circuit as recited in claim 1, wherein the switching means employs an NMOS transistor.

3. The bit line voltage regulation circuit as recited in claim 2, wherein a minimum amplified voltage of the amplifying means is higher by an amount approximately equal to a threshold voltage of the NMOS transistor.

4. A bit line voltage regulation circuit comprising:
   a boosting unit for generating a high voltage;
   a switching unit, connected between the boosting unit and a bit line of a memory cell array, for transferring the high voltage to the bit line; and
   an amplifying unit for detecting a voltage drop at a detection node on the bit line caused by resistance on the bit line, amplifying the detected voltage drop to produce an amplified voltage driving the switching unit,
   wherein the amplifying unit generates the amplified voltage according to a ratio of the total resistance on the hit line to resistance at the detection node.

5. The bit line voltage regulation circuit as recited in claim 4, wherein the switching unit employs an NMOS transistor.

6. The bit line voltage regulation circuit as recited in claim 5, wherein a minimum amplified voltage of the amplifying unit is higher than a voltage required in driving the NMOS transistor by an amount approximately equal to a threshold voltage of the NMOS transistor.

* * * * *